United States Patent
Huott et al.

(10) Patent No.: US 9,983,261 B2
(45) Date of Patent: May 29, 2018

(54) PARTITION-ABLE STORAGE OF TEST RESULTS USING INACTIVE STORAGE ELEMENTS

(71) Applicant: INTERNATIONAL BUSINESS MACHINES CORPORATION, Armonk, NY (US)

(72) Inventors: William V. Huott, Holmes, NY (US); Thomas J. Knips, Wappingers Falls, NY (US); Pradip Patel, Poughkeepsie, NY (US); Daniel Rodko, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 37 days.

(21) Appl. No.: 15/170,365

(22) Filed: Jun. 1, 2016

(65) Prior Publication Data

US 2017/0350940 A1 Dec. 7, 2017

(51) Int. Cl.
*G01R 31/28* (2006.01)
*G01R 31/317* (2006.01)
*G01R 31/3177* (2006.01)

(52) U.S. Cl.
CPC ... *G01R 31/31724* (2013.01); *G01R 31/3177* (2013.01); *G01R 31/31722* (2013.01)

(58) Field of Classification Search
CPC ........ G01R 31/31724; G01R 31/31722; G01R 31/3177
See application file for complete search history.

(56) References Cited

U.S. PATENT DOCUMENTS

| | | | |
|---|---|---|---|
| 6,584,023 B1 | 6/2003 | Bunce et al. |
| 6,668,347 B1 | 12/2003 | Babella et al. |
| 7,009,895 B2 | 3/2006 | Bunce et al. |
| 7,064,990 B1 | 6/2006 | Dawson et al. |
| 7,068,554 B1 | 6/2006 | Dawson et al. |
| 7,076,706 B2 | 6/2006 | Eckelman et al. |
| 7,076,710 B2 | 6/2006 | Knips et al. |
| 7,073,105 B2 | 7/2006 | Knips et al. |
| 7,170,320 B2 | 1/2007 | Dawson et al. |
| 7,210,084 B2 | 4/2007 | Bunce et al. |
| 7,219,275 B2 | 5/2007 | Chang et al. |

(Continued)

*Primary Examiner* — Thien Nguyen
(74) *Attorney, Agent, or Firm* — Cantor Colburn LLP; Margaret A. McNamara

(57) ABSTRACT

Aspects of present disclosure relate to an integrated circuit chip (chip), a method and a computer program product of testing the chip. The method of testing the chip may include: partitioning the chip into various partitions, loading built-in self-test (BIST) test instructions into BIST engine and initializing a current partition counter, performing BIST test on current partition, transmitting test results of the current partition of the chip to an external test data storage, checking whether current partition is the last partition, incrementing current partition counter, and returning to performing BIST on a next partition when current partition is not the last partition, and exiting BIST test when current partition is the last partition. The test results may be stored in one or more inactive storage elements of the chip. The number of partitions may include: one partition, a predetermined number of partitions, and a variable number of partitions.

20 Claims, 5 Drawing Sheets

(56) References Cited

U.S. PATENT DOCUMENTS

| | | |
|---|---|---|
| 7,373,573 B2 | 5/2008 | Riley |
| 7,380,191 B2 | 5/2008 | Dawson et al. |
| 7,529,997 B2 | 5/2009 | Meaney et al. |
| 7,707,466 B2 | 4/2010 | Gupta et al. |
| 7,930,601 B2 | 4/2011 | Eckelman et al. |
| 8,132,131 B2 | 3/2012 | Barth, Jr. et al. |
| 8,341,476 B1* | 12/2012 | Peng ................ G11C 5/025 |
| | | 714/733 |
| 8,438,437 B2 | 5/2013 | Jain et al. |
| 8,607,110 B1* | 12/2013 | Peng ................ G11C 5/025 |
| | | 714/733 |
| 8,612,813 B2 | 12/2013 | Chickanosky et al. |
| 8,730,743 B2 | 5/2014 | Cho |
| 2009/0158224 A1* | 6/2009 | Barth, Jr. ........... G11C 29/24 |
| | | 716/136 |
| 2013/0139010 A1 | 3/2013 | Chickanosky et al. |
| 2014/0006889 A1* | 1/2014 | Motika ........ G01R 31/318547 |
| | | 714/732 |

* cited by examiner

PARTITION-ABLE STORAGE OF TEST RESULTS USING INACTIVE STORAGE ELEMENTS

BACKGROUND

The present disclosure relates generally to integrated circuit chip, and more particularly to partition-able storage of chip test results using inactive storage elements during chip tests.

An integrated circuit chip (IC chip, or chip) may include normal functional circuits, such as arithmetic logic unit (ALU), floating-point unit (FPU), registers, scan latches, and memory. In order to ensure the quality of the chip, certain additional circuits are added to the chip for testing, repair, and test results logging. These circuits may include built-in self-test (BIST) engines, memory built-in self-test (Mem-BIST) engines, logic built-in self-test (LBIST) engines, and built-in self-repair (BISR) engines. Additional circuits, latches, and memory, such as failed logic registers and failed address registers, are typically added to the chip to store test results from these BIST engines. There is a trade-off as to how much of this information is retained on chip (costing chip area) before being extracted by the tester vs. extracting fail data more frequently with the tester (costing more test time, but less chip area). It is desirable to have a chip test scheme that requires minimal test time for chip testing and minimal chip area for storing chip test results.

Therefore, heretofore unaddressed needs still exist in the art to address the aforementioned deficiencies and inadequacies.

SUMMARY

In one aspect, the present disclosure relates to a method for testing an integrated circuit chip. In certain embodiments, the method may include: partitioning the integrated circuit chip into one or more partitions, loading built-in self-test (BIST) test instructions into a BIST engine and initializing a current partition counter for a current partition, performing a BIST test on the current partition, transmitting test results of the current partition of the integrated circuit chip to an external test data storage, checking whether the current partition is the last partition, incrementing the current partition counter, and returning to performing BIST on a next partition when the current partition is not the last partition, and exiting the BIST test when the current partition is the last partition. The test results may be stored in one or more inactive storage elements of the integrated circuit chip. The number of partitions may include one partition, a predetermined number of partitions, and a variable number of partitions.

In another aspect, the present disclosure relates to an integrated circuit chip. In certain embodiments, the integrated circuit chip may include: one or more functional logic elements configured to perform one or more functions of the integrated circuit chip, one or more memory elements configured to store information and computer executable instructions, a built-in self-test (BIST) engine configured to perform BIST tests of the integrated circuit chip, one or more failed logic registers (FLR) configured to store test results of one or more functional logic tests, and one or more failed address registers (FAR) configured to store test results of one or more memory tests. The computer executable instructions, when executed at the BIST engine, perform a method of integrated circuit test. The test results may be stored in one or more inactive storage elements of the integrated circuit chip.

In yet another aspect, the present disclosure relates to a computer program product operable on an built-in self-test (BIST) engine of an integrated circuit chip for testing the integrated circuit chip. The computer program product may include a computer readable storage medium having computer executable instructions embodied. When the computer executable instructions are executed by the BIST engine, the computer executable instructions cause the BIST engine to perform: partitioning the integrated circuit chip into one or more partitions, loading BIST test instructions into the BIST engine and initializing a current partition counter for a current partition, performing BIST test on the current partition, transmitting test results of the current partition of the integrated circuit chip to an external test data storage, checking whether the current partition is the last partition, incrementing the current partition counter, and returning to performing BIST on a next partition when the current partition is not the last partition, and exiting the BIST test when the current partition is the last partition. The test results may be stored in one or more inactive storage elements of the integrated circuit chip. The number of partitions may include: one partition, a predetermined number of partitions, and a variable number of partitions.

This invention involves reusing functional scan latch elements, that are already on-chip for normal function but not participating in the current test, as storage elements for the test results of the current test. For example, during memory test, this invention would dramatically reduce chip area overhead by using only the "minimum" number of traditional "Failed Address Registers" (FARs). "Minimum" could mean just enough FARs needed to repair only 1 memory instance in a larger group of memories (or even just enough repairs for 1 sub-section of a larger memory). Upon completing the testing of the 1st memory (or memory sub-section) in a larger group, a shift operation would be performed, at fast chip speeds, to unload the FAR's contents into the unused functional scan latches on-chip arranged to accept and store this information as a long scan chain. Memory testing would then resume on the next section of memory which, upon completion, would also have it's FAR results shifted and stored into the same long unused functional scan chain. This procedure would repeat until all of the memories (or memory sub-sections) are tested and all of their FAR results are stored in the long functional scan chain re-purposed for this memory test. Finally, all of the memory test FAR results could be scanned out of the long functional scan chain and stored on the tester or continue to be processed on the chip with a "Built-In-Self-Repair" operation. With this invention, for example, 1 (time saving) pass of on-chip memory testing could log several thousands of bits of FAR data while using only the area overhead of a few hundred FAR latches. Variable partitioning of test space size (ie: memory address space), could allow for the complete data logging of all fails (even on non-repairable chips) for diagnostic purposes (ie: Memory Bit Fail Maps).

These and other aspects of the present disclosure will become apparent from the following description of the preferred embodiment taken in conjunction with the following drawings and their captions, although variations and modifications therein may be affected without departing from the spirit and scope of the novel concepts of the present disclosure.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION

Figure 1:
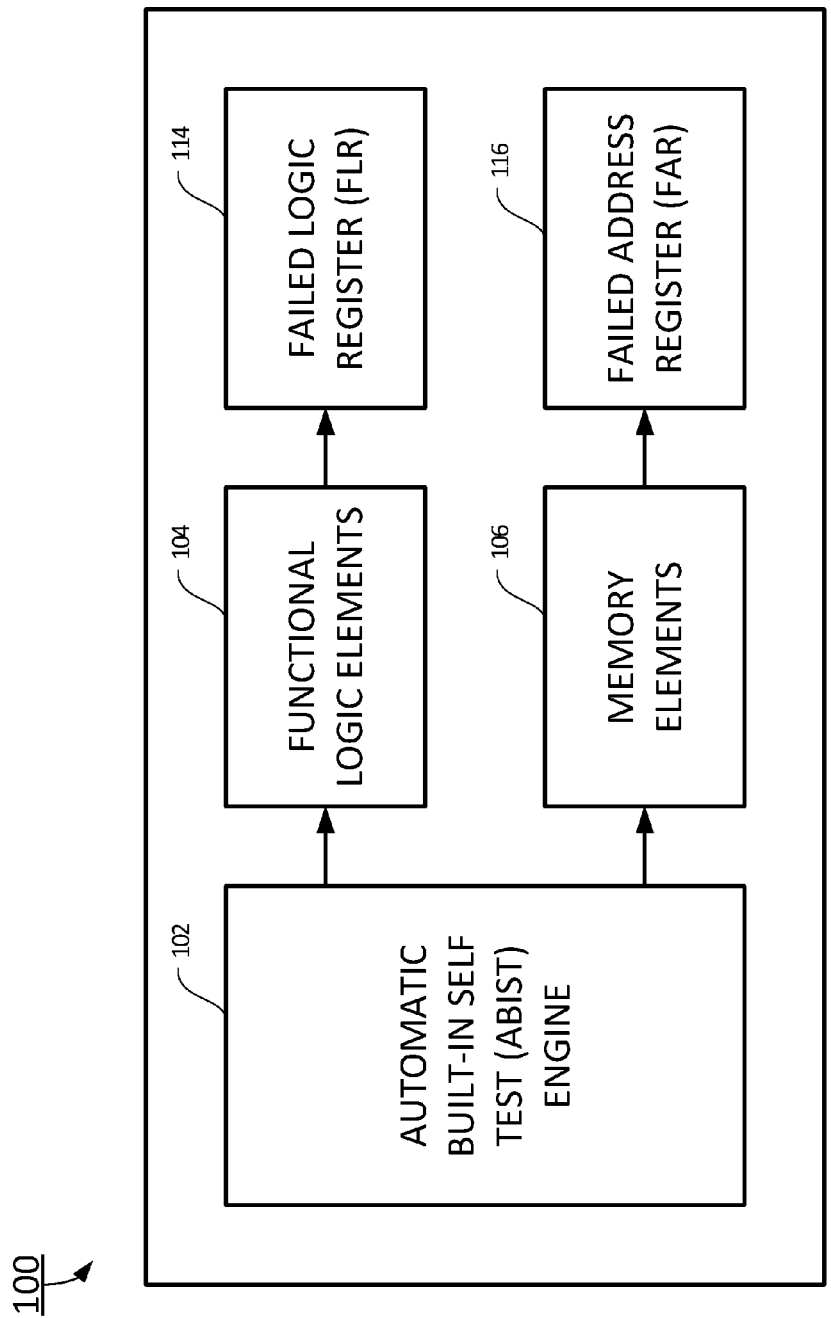
FIG. 1 is a block diagram showing an integrated circuit chip having its functional elements and additional elements for testing and repairing according to certain embodiments of the present disclosure.

The present disclosure is more particularly described in the following examples that are intended as illustrative only because numerous modifications and variations therein will be apparent to those skilled in the art. Various embodiments of the invention are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the present disclosure, and in the specific context where each term is used. Certain terms that are used to describe the present disclosure are discussed below, or elsewhere in the specification, to provide additional guidance to the practitioner regarding the description of the present disclosure. It will be appreciated that same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the present disclosure or of any exemplified term. Likewise, the present disclosure is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "plurality" means two or more. The terms "comprising," "including," "carrying," "having," "contain-ing," "involving," and the like are to be understood to be open-ended, i.e., to mean including but not limited to.

An integrated circuit chip (IC chip, or chip) may include normal functional circuits, such as arithmetic logic unit (ALU), floating-point unit (FPU), registers, scan latches, and memory. In order to ensure the quality of the chip, certain additional circuitries are added to the chip to test the chip, to store the test results, and to repair the chips according to the test results. These circuitries may include built-in self-test (BIST) engine, memory built-in self-test (MemBIST) engine, and built-in self-repair (BISR) engine. Additional memory, such as failed logic registers and failed address registers, may be added to store test results from these BIST engines. There is a trade-off as to how much of this information is retained on chip (costing chip area) before being extracted by the tester vs. extracting fail data more frequently with the tester (costing more test time, but less chip area). The present disclosure is directed to a chip test scheme that requires minimal test time for chip testing and minimal chip area for storing chip test results.

The present disclosure will now be described more fully hereinafter with reference to the accompanying drawings FIGS. 1-5, in which certain exemplary embodiments of the present disclosure are shown. The present disclosure may, however, be embodied in many different forms and should not be construed as limited to the embodiments set forth herein; rather, these embodiments are provided so that this invention will be thorough and complete, and will fully convey the scope of the invention to those skilled in the art.

In one aspect, the present disclosure relates to integrated circuit chip (hereinafter chip) testing and repairing. In certain embodiments, the chip may include, central processing units (CPUs), digital signal processing (DSP) chips, graphical processing units (GPUs), system-on-a-chip (SOC), three dimensional integrated circuits (3D-IC), application-specific integrated circuits (ASICs), and various memory chip such as volatile memory, random access memory (RAM), non-volatile random access memory (NVRAM), read-only memory (ROM), programmable read-only memory (PROM), erasable programmable read-only memory (EPROM), and various solid state drive (SSD).

Referring now to FIG. 1, a block diagram showing an integrated circuit chip (chip) 100 having its functional elements and additional elements for testing and repairing according to certain embodiments of the present disclosure. The chip 100 may include one or more functional logic elements 104, and one or more memory elements 106. The functional logic elements 104 of the chip 100 may include one or more cores, one or more processing logic units, one or more arithmetic logic units (ALU), one or more floating-point units (FPU), one or more registers, one or more scan latches and other necessary functional logic units to perform the functional the chip is designed to perform. Most chips may also include memory elements 106 of various sizes. In certain embodiments, the chip 100 may be a memory chip and contains primarily memory cells in different capacities.

In order to ensure the quality of the chip 100, additional circuitries may be included in the chip 100 to test, verify, and potentially repair the chip. These circuitries may include a built-in self-test (BIST) engine 102. The BIST engine 102 is used to test the functional logic elements 104, and the memory elements 106. These tests yield certain test results, and these test results should be preserved for product quality determination, and/or for potential repair if additional redundancy elements are designed and built in. In certain embodiments, the test results for functional logic elements 104 may be stored in one or more failed logic registers (FLR) 114, and the test results for memory elements 106 may be stored in one or more failed address registers (FAR) 116.

In certain embodiments, the one or more FLRs 114 may be pass/fail checkers, multiple-input-signature-registers (MISRs), or other checksum registers. In certain embodiments, FARs essentially capture the failing addresses of the memory under test and store them until testing is complete, allowing this information to be used for the potential repair of, (or rejection of), the memory under test, as well as provide diagnostic, analytic, and defect bit fail map data for yield learning. There may be multiple embodiments of FARs. These include "dedicated FARs", where each memory array instance on-chip has it's own "dedicated FARs", and "shared FARs", where multiple memory array instances have their responses combined and failing addresses combined into 1 set of FARs. Shared FARs are generally employed in an effort to use the on-chip FAR area more efficiently. Since not all memory instances will require repairs and they rarely require their maximum number of possible repairs, sharing FARs allows the memory instances that need more repairs to use FAR space that is not needed by memory instances that don't need as many repairs. While this helps to reduce the FAR overhead on-chip, it is still common to need to do multiple passes of testing in order to extract all of the FAR data because it is often too costly to provide enough FAR area on-chip to store all the repairs needed by all of the memory instances.

During integrated circuit memory and logic testing, test results, signatures and other fail data are often collected and used for: (a) pass or fail determination, (b) partial good determination (where only part of the chip may be good and usable), (c) possible repair information for the device under test, (d) diagnostics for failing devices or sections of devices, and (e) analytics of fail data from improved yield learning.

Conventionally, a certain amount of FLRs 114 and/or FARs 116 are built into the chip 100, and this amount FLRs 114 and/or FARs 116 usually is not big enough to collect all test results, signatures and other fail data. The tests of functional logic elements 104 and/or tests of the memory elements 106 may have to be divided into certain number of partitions such that the amount FLRs 114 and/or FARs 116 built-in in the chip 100 may be big enough to store the test results, signatures and other fail data for each partition. Once one partition test is completed, the test results, signatures and other fail data may be transmitted out of the chip, the FLRs 114 and/or FARs 116 are reset, then the test for the next partition starts, until all partitions are tested and the test results, signatures and other fail data are collected for each of the partitions.

There is a trade-off as to how much of this information is retained on chip (costing chip area) before being extracted by the tester vs. extracting fail data more frequently with the tester (costing more test time, but less chip area). For example, integrated circuits that contain large amounts of memory typically log a great deal of repairable memory address data necessary to repair failing memories (by using spare or redundant memory elements designed into the device for the purpose of yield improvement through memory repair). Diagnostics and analytics are also done with this data in the case of memory bit-fail-maps. The latches and logic necessary to store all of this information on-chip can cost a significant amount of chip area.

However, using fewer latches and on-chip logic to store this information requires more testing steps to extract this information more frequently during the testing procedure which is costly in test time.

In one aspect, the present disclosure is directed to a test scheme that minimizes the test time for chip testing and the chip area for storing chip test results. In certain embodiments, the BIST engine 102 may be programmed to test the functional logic elements 104 and the memory elements 106 in two different test phases.

When the BIST engine 102 is testing the functional logic elements 104, the memory elements 106 of the functional logic are unused, and the FARs 116 are inactive. When the BIST engine 102 is testing the memory elements 106, the functional logic elements 104 are unused, and the FLRs 114 are inactive.

Figure 2:
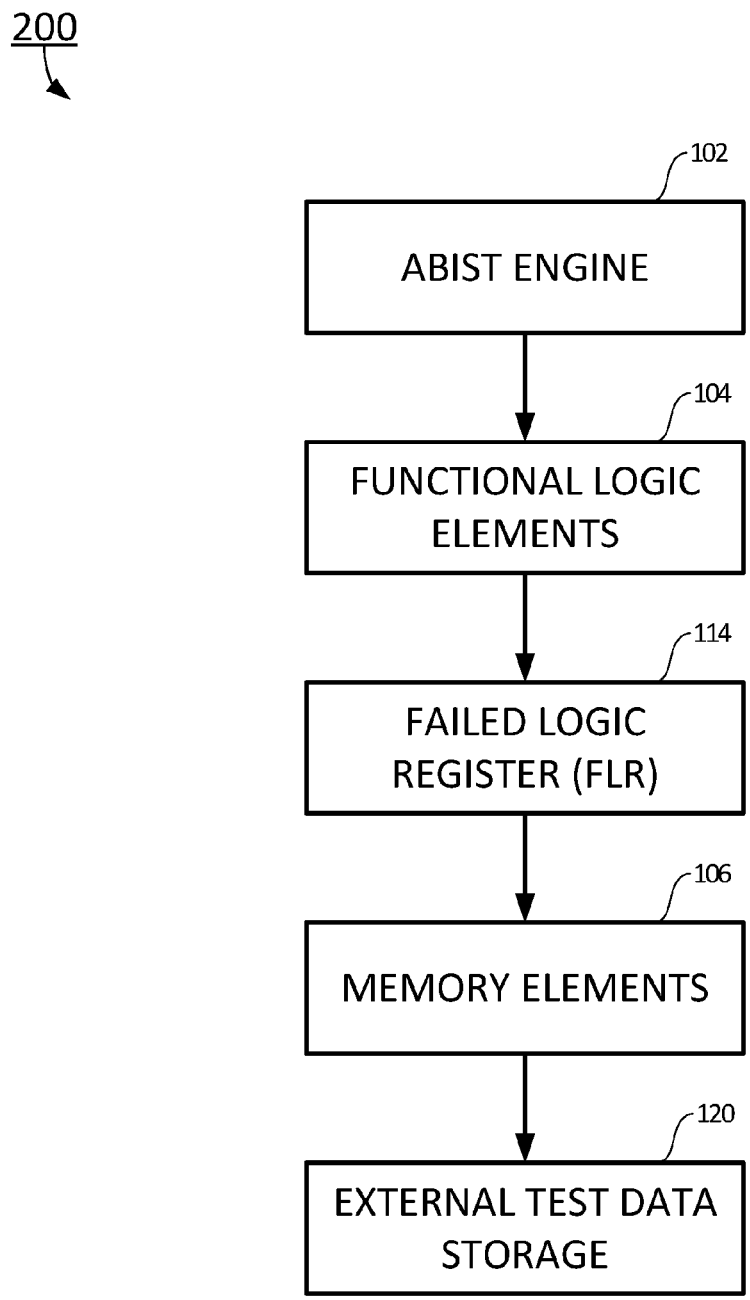
FIG. 2 is a block diagram of a functional logic test that uses certain memory elements to store test results according to certain embodiments of the present disclosure.

Referring now to FIG. 2, a block diagram 200 of a functional logic test that uses certain unused functional logic memory elements 106 to store test results is shown according to certain embodiments of the present disclosure. At the start, the BIST engine 102 may initiate the functional logic test. Each of the one or more functional logic elements under test 104 is tested, and the failed logic information is stored into the built-in FLRs 114. In certain embodiments, when the built-in FLRs 114 is about to be full, the BIST engine 102 may halt the test and transmit the test results stored in the built-in FLRs 114 to the one or more unused functional logic memory elements 106 on the chip 100. This may complete one partition of the functional logic test, and once the test results of the completed partition is stored in the one or more unused functional logic memory elements 106 on the chip 100, the next partition may be tested. Such tests are repeated until each of the one or more functional logic elements under test 104 is fully tested.

Once each of the one or more functional logic elements under test 104 is fully tested, the test results stored in the one or more unused functional logic memory elements 106 may be transmitted to an external test data storage 120 for further processing and analysis.

Figure 3:
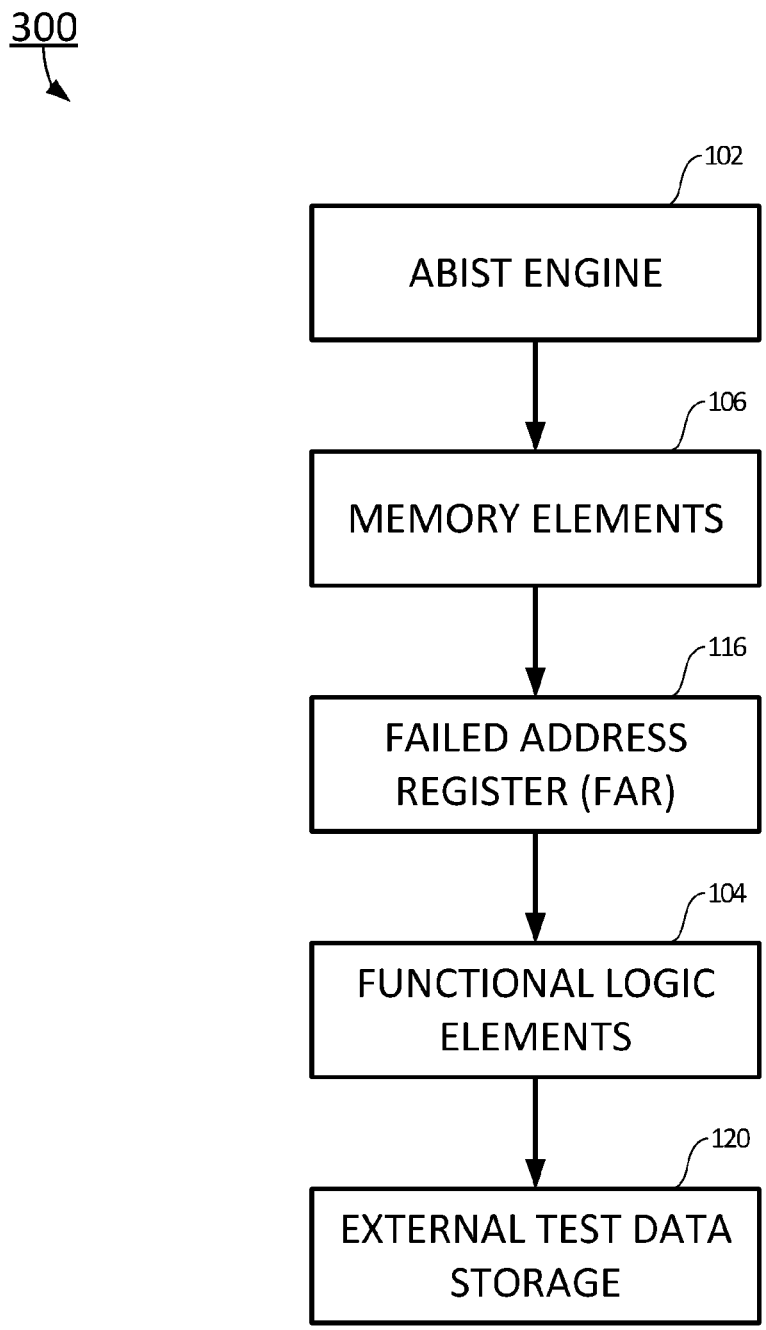
FIG. 3 is a block diagram of a memory test that uses certain functional logic elements to store test results according to certain embodiments of the present disclosure.

Referring now to FIG. 3, a block diagram 300 of a memory test that uses certain unused functional logic memory elements 104 to store test results is shown according to certain embodiments of the present disclosure. At the start, the BIST engine 102 may initiate the functional logic test. Each of the one or more memory elements under test 106 is tested, and the memory address information is stored into the built-in FARs 116. In certain embodiments, when the built-in FARs 116 is about to be full, the BIST engine 102 may halt the test and transmit the test results stored in the built-in FARs 116 to the one or more unused functional logic memory elements 104 on the chip 100. This may complete one partition of the memory test, and once the test results of the completed partition is stored in the one or more unused functional logic memory elements 104 on the chip 100, the next partition may be tested. Such tests are repeated until each of the one or more memory elements under test 106 is fully tested.

Once each of the one or more memory elements 106 is fully tested, the test results stored in the one or more unused functional logic memory elements 104 may be transmitted to the external test data storage 120 for further processing and analysis.

Since the one or more unused functional logic memory elements 106 on the chip 100 were inactive during the functional logic test, and the one or more unused functional logic elements 104 on the chip 100 were inactive during the functional logic test, these unused memory elements 106 may be used for reducing the number and size of the FLRs 114, and the functional logic elements 104 may be used for reducing the number and size of the FARs 116. One of the benefits of using the new test scheme disclosed in FIG. 2, and FIG. 3 may be a reduction of the number and sizes of the FLRs 114, and the FARs 116. Another benefit of using the new test scheme disclosed in FIG. 2, and FIG. 3 may allow the test partition to be variable in size, reduce the halting of the functional logic test and the memory test, and speed up the functional logic test and the memory test.

In certain embodiments, during memory test, this invention would dramatically reduce chip area overhead by using only the "minimum" number of traditional FARs. "Minimum" could mean just enough FARs needed to repair only 1 memory instance in a larger group of memories (or even just enough repairs for 1 sub-section of a larger memory). Upon completing the testing of the 1st memory (or memory sub-section) in a larger group, a shift operation would be performed, at fast chip speeds, to unload the FAR's contents into the unused functional logic elements on-chip arranged to accept and store this information. Memory testing would then resume on the next section of memory which, upon completion, would also have it's FAR results shifted and stored into the same unused functional logic elements 104. This procedure would repeat until all of the memories (or memory sub-sections) are tested and all of their FAR results are stored in the inactive functional logic elements 104 re-purposed for this memory test. Finally, all of the memory test FAR results could be transmitted to the external test data storage 120 or continue to be processed on the chip with a "Built-In-Self-Repair" (BISR) operation. In certain embodiments, 1 (time saving) pass of on-chip memory testing could log several thousands of bits of FAR data while using only the area overhead of a few hundred FAR latches. Variable partitioning of test space size (ie: memory address space), could allow for the complete data logging of all fails (even on non-repairable chips) for diagnostic purposes (i.e. Memory Bit Fail Maps).

Figure 4:
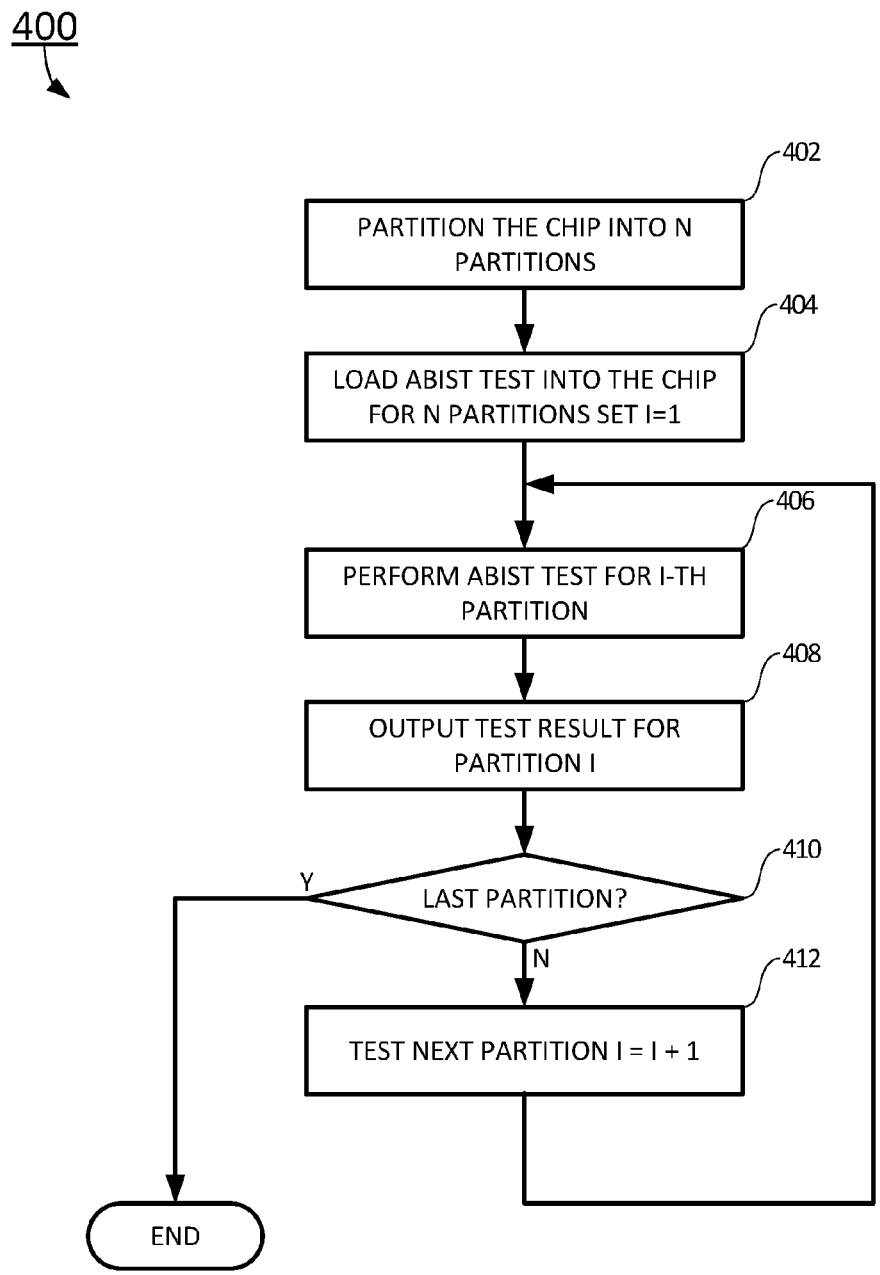
FIG. 4 is a flowchart showing a method of chip testing using partitionable storage of chip test results using inactive storage elements during chip tests according to certain embodiments of the present disclosure.

In another aspect, the present disclosure relates to a method 400 of chip testing using partitionable storage of chip test results using inactive storage elements as shown in FIG. 4 according to certain embodiments of the present disclosure.

At block 402, the method 400 may partition the chip into N partitions based on existing number and size of the FLRs 114 and the FARs 116.

In one embodiment, the number of partition is fixed. When a current partition is completed, the test results of the current partition are retrieved and transmitted to one or more inactive storage elements on the chip from the FLRs 114 for functional logic test and/or from the FARs 116 for memory test. At this time, the FLRs 114 and/or the FARs 116 may not be full, and the usage of the FLRs 114 and/or the FARs 116 may not be very efficient.

In another embodiment, the number of the partition may be variable. During the test, the test results are stored in the FLRs 114 and/or the FARs 116. When the FLRs 114 and/or the FARs 116 are about to be full, the BIST engine 102 may halt the test and transmit the test results in the FLRs 114 and/or the FARs 116 to the external test data storage 120. In this case, the FLRs 114 and/or the FARs 116 may be fully and efficiently utilized, and the size of the partition is variable, not fixed.

In yet another embodiment, the partition number N may be 1, or the test is not partitioned. In this case, the size of the FLRs 114 and/or the FARs 116 may one. Every time when a failure is detected during the test, the test fail data, or failed memory address may be first stored on the FLRs 114 and/or the FARs 116, and immediately transmitted to the external test data storage 120. In this case, it may only take one clock cycle to transmit the test results to the external test data storage 120, which is very fast and may not affect the test time. On the other hand, the size of the FLRs 114 and/or the FARs 116 may be reduced to one, which dramatically reduces the overhead of the FLRs 114 and/or the FARs 116 on the chip 100.

At block 404, test instructions are loaded into the BIST engine 102, and the partition number I is initialized to 1 before the BIST starts.

At block 406, the BIST engine 102 may perform a test on current partition I. Detailed test process will be described in FIG. 5 according to certain embodiments.

At block 408, the BIST engine 102 may retrieve the test results in the FLRs 114 and/or FARs 116 and transmit the test results retrieved to the external test data storage 120.

At query block 410, the BIST engine 102 may check if the current partition is the last partition (I=N?). When the current partition is not the last partition, the BIST engine 102 may proceed to block 412. When the current partition is the last partition, the BIST engine 102 may complete the test.

At block 412, the BIST engine 102 may increment the current partition counter by one to next partition (I=I+1) and return to block 406 to test the next partition.

Figure 5:
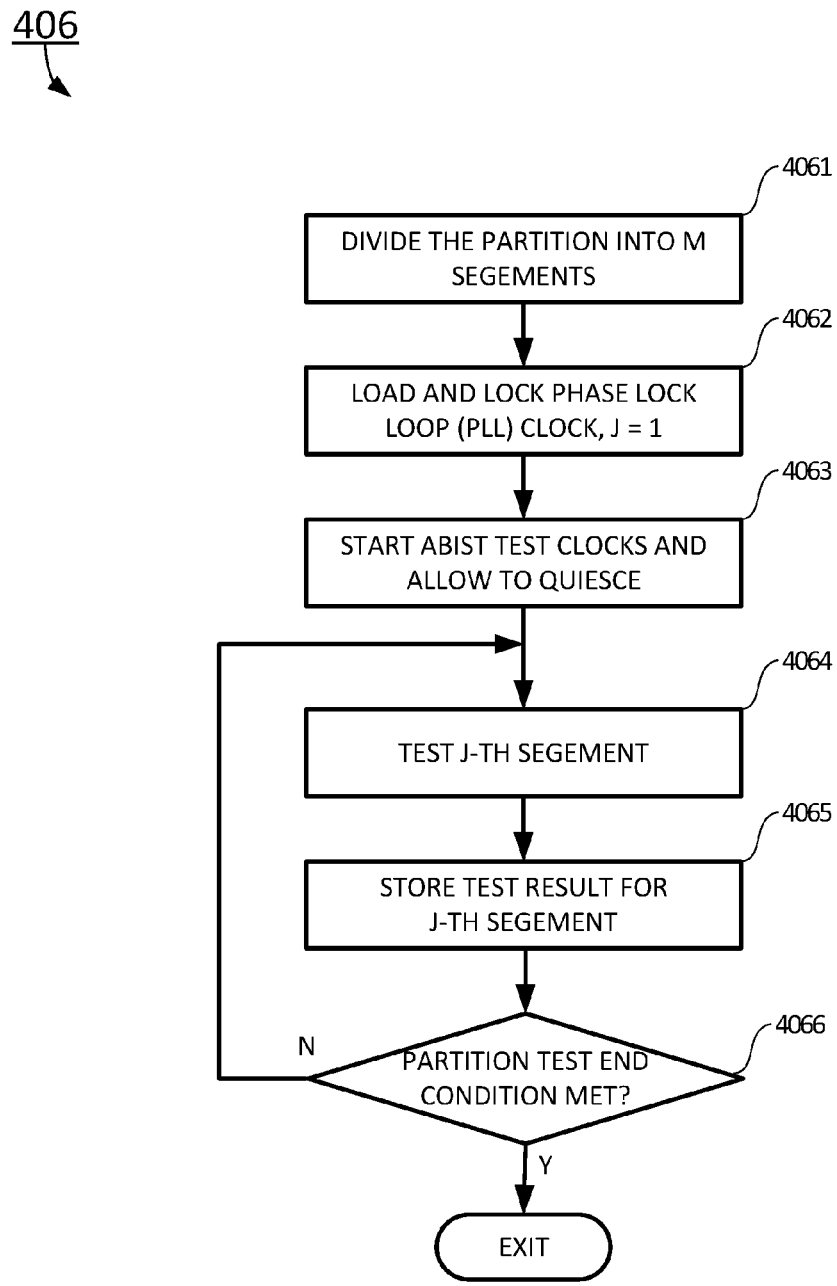
FIG. 5 is a flow chart showing a detailed portion of a built-in self-test (BIST) of the method shown in FIG. 4 according to certain embodiments of the present disclosure.

Referring now to FIG. 5, a flow chart 406 is shown according to certain embodiments of the present disclosure. FIG. 5 shows a detailed block 406 portion of BIST of the method 400 as shown in FIG. 4.

At block 4061, the BIST engine 102 may divide the partition under test into M segments. In one embodiment, the test may be carried on the one or more functional logic elements 104, and each segment may be one of many functional logic elements in the partition under test. In another embodiment, the test may be carried on the one or more memory elements 106, and each segment may be one of many memory cells, memory rows or memory columns of the memory partition under test.

At block 4062, the BIST engine 102 may load and lock the phase locked loop (PLL), and set a segment count to a first segment, J=1.

At block 4063, the BIST engine 102 may start the BIST test clocks and allow to quiesce.

At block 4064, the BIST engine 102 may test the J-th segment.

At block 4065, test result or failing address information of the J-th segment may be stored in an inactive storage element. In one embodiment, during a functional logic test, the test result may be stored in an inactive memory element 106. In another embodiment, during a memory test, the failing memory address may be stored in an inactive functional logic element 104.

At query block 4066, the BIST engine 102 may check if a partition test ending condition is met. In one embodiment, the partition test ending condition may include whether the current segment J is the last segment of the partition under test. In another embodiment, the partition test ending condition may include when the FLRs are full for the functional logic test, and when the FARs are full for the memory test.

When the partition test ending condition is not met, the BIST engine 102 may proceed to block 4064. When the partition test ending condition is met, the BIST engine 102 may exit the test of the partition under test.

Aspects of the present disclosure are described herein with reference to flowchart illustrations and/or block diagrams of methods. It will be understood that each block of the flowchart illustrations and/or block diagrams, and combinations of blocks in the flowchart illustrations and/or block diagrams, can be implemented by computer readable program instructions or hardware.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of testing an integrated circuit chip, comprising:
    partitioning the integrated circuit chip into one or more partitions, the integrated circuit chip comprising one or more functional logic elements configured to perform one or more functions of the intergrated circuit chip, and one or more memory elements configured to store information and computer executable instructions;
    loading built-in self-test (BIST) test instructions into a BIST engine, and initializing a current partition counter for a current partition;
    performing BIST test on the current partition to obtain test results;
    performing a selection from the group consisting of:
        storing the test results of one or more functional logic tests to one or more failed logic registers (FLR), and transmitting the test results of the one or more functional logic tests from the FLR to the one or more memory elements that are inactive when the BIST test on the current partition is completed; and
        storing the test results of the one or more memory tests to one or more failed address registers (FAR), and transmitting the test results of the one or more memory tests from the FAR to the one or more functional logic elements that are inactive when the BIST test on the current partition is completed;
    transmitting the test results of the current partition of the integrated circuit chip to an external test data storage;
    checking whether the current partition is the last partition;
    incrementing the current partition counter, and returning to performing BIST on a next partition when the current partition is not a last partition, and exiting the BIST test when the current partition is the last partition.

2. The method of claim 1, wherein the integrated circuit chip comprises:
    the built-in self-test (BIST) engine configured to perform BIST tests of the integrated circuit chip;
    the one or more failed logic registers (FLR) configured to store test results of one or more functional logic tests; and
    the one or more failed address registers (FAR) configured to store test results of one or more memory tests.

3. The method of claim 2, wherein the performing BIST test on current partition comprises:
    dividing the current partition into one or more segments;
    initializing a current segment counter for a current segment;
    performing BIST tests of the current segment;
    storing test result of the current segment;
    checking whether a partition test end condition is met,
    returning to performing BIST on a next segment when the partition test end condition is not met, and exiting the BIST test for the current partition when the partition test end condition is met.

4. The method of claim 3, wherein the BIST test comprises:
    a plurality of tests of functional logic elements of the integrated circuit chip; and
    a plurality of tests of memory elements of the integrated circuit chip.

5. The method of claim 4, wherein the storing test result of the current segment comprises storing the test result of the current segment in the one or more failed logic registers (FLR) for the plurality of tests of functional logic elements of the integrated circuit chip on the current partition, and transmitting the test results to one or more inactive memory elements of the integrated circuit chip when the tests on the current partition are completed.

6. The method of claim 4, wherein the storing test result of the current segment comprises storing the test result of the current segment in one or more failed address registers (FAR) for the plurality of tests of memory elements of the integrated circuit chip on the current partition, and transmitting the test results to one or more inactive functional logic elements of the integrated circuit chip when the tests on the current partition are completed.

7. The method of claim 1, wherein a number of partitions comprises:
    one partition;
    a predetermined number of partitions; and
    a variable number of partitions.

8. An integrated circuit chip comprising:
    one or more functional logic elements configured to perform one or more functions of the integrated circuit chip;
    one or more memory elements configured to store information and computer executable instructions;
    a built-in self-test (BIST) engine configured to perform BIST tests of the integrated circuit chip;
    one or more failed logic registers (FLR) configured to store test results of one or more functional logic tests; and
    one or more failed address registers (FAR) configured to store test results of one or more memory tests,
    wherein the computer executable instructions, when executed at the BIST engine, perform a method of integrated circuit test, comprising:
        partitioning the integrated circuit chip into one or more partitions;

loading built-in self-test (BIST) test instructions into the BIST engine, and initializing a current partition counter for a current partition;
performing BIST test on the current partition to obtain test results;
performing a selection from the group consisting of:
storing the test results of one or more functional logic tests to one or more failed logic returns (FLR), and transmitting the test results of the one or more functional logic tests from the FLR to the one or more memory elements that are inactive when the BIST test on the current partition is completed; and
storing the test results of the one or more memory tests to one or more failed address registers (FAR), and transmitting the test results of the one or more memory tests from the FAR to the one or more functional logic elements that are inactive when the BIST test on the current partition is completed;
transmitting the test results of the current partition of the integrated circuit chip to an external test data storage;
checking whether the current partition is the last partition;
incrementing the current partition counter, and returning to performing BIST on a next partition when the current partition is not a last partition, and exiting the BIST test when the current partition is the last partition.

9. The integrated circuit chip of claim 8, wherein the performing BIST test on current partition comprises:
dividing the current partition into one or more segments;
initializing a current segment counter for a current segment;
performing BIST tests of the current segment;
storing test result of the current segment;
checking whether a partition test end condition is met, returning to performing BIST on a next segment when the partition test end condition is not met, and exiting the BIST test for the current partition when the partition test end condition is met.

10. The integrated circuit chip of claim 9, wherein the BIST test comprises:
a plurality of tests of functional logic elements of the integrated circuit chip; and
a plurality of tests of memory elements of the integrated circuit chip.

11. The integrated circuit chip of claim 10, wherein the storing test result of the current segment comprises storing test result of the current segment in the one or more failed logic registers (FLR) for the plurality of tests of functional logic elements of the integrated circuit chip on the current partition, and transmitting the test results to one or more inactive memory elements of the integrated circuit chip when the tests on the current partition are completed.

12. The integrated circuit chip of claim 10, wherein the storing test result of the current segment comprises storing the test result of the current segment in one or more failed address registers (FAR) for the plurality of tests of memory elements of the integrated circuit chip on the current partition, and transmitting the test results to one or more inactive functional logic elements of the integrated circuit chip when the tests on the current partition are completed.

13. The integrated circuit chip of claim 8, wherein a number of partitions comprises:
one partition;
a predetermined number of partitions; and
a variable number of partitions.

14. A computer program product operable on a built-in self-test (BIST) engine of an integrated circuit chip for testing the integrated circuit chip comprising a computer readable storage medium having computer executable instructions embodied therewith, the computer executable instructions executable by the BIST engine to cause a processor to perform:
partitioning the integrated circuit chip into one or more partitions, the integrated circuit chip comprising one or more functional logic elements configured to perform one or more functions of the intergrated circuit chip, and one or more memory elements configured to store information and computer executable instructions;
loading BIST test instructions into the BIST engine, and initializing a current partition counter for a current partition;
performing BIST test on the current partition to obtain test results;
performing a selection from the group consisting of:
storing the test results of one or more functional logic tests to one or more failed logic returns (FLR), and transmitting the test results of the one or more functional logic tests from the FLR to the one or more memory elements that are inactive when the BIST test on the current partition is completed; and
storing the test results of the one or more memory tests to one or more failed address registers (FAR), and transmitting the test results of the one or more memory tests from the FAR to the one or more functional logic elements that are inactive when the BIST test on the current partition is completed;
transmitting test results of the current partition of the integrated circuit chip to an external test data storage;
checking whether the current partition is the last partition;
incrementing the current partition counter, and returning to performing BIST on a next partition when the current partition is not a last partition, and exiting the BIST test when the current partition is the last partition.

15. The computer program product of claim 14, wherein the integrated circuit chip comprises:
a built-in self-test (BIST) engine configured to perform BIST tests of the integrated circuit chip;
the one or more failed logic registers (FLR) configured to store test results of the one or more functional logic tests; and
the one or more failed address registers (FAR) configured to store test results of the one or more functional logic tests.

16. The computer program product of claim 15, wherein the performing BIST test on current partition comprises:
dividing the current partition into one or more segments;
initializing a current segment counter for a current segment;
performing BIST tests of the current segment;
storing test result of the current segment;
checking whether a partition test end condition is met, returning to performing BIST on a next segment when the partition test end condition is not met, and exiting the BIST test for the current partition when the partition test end condition is met.

17. The computer program product of claim 16, wherein the BIST test comprises:
a plurality of tests of functional logic elements of the integrated circuit chip; and
a plurality of tests of memory elements of the integrated circuit chip.

18. The computer program product of claim 17, wherein the storing test result of the current segment comprises storing the test result of the current segment in the one or more failed logic registers (FLR) for the plurality of tests of functional logic elements of the integrated circuit chip on the current partition, and transmitting the test results to one or more inactive memory elements of the integrated circuit chip when the tests on the current partition are completed.

19. The computer program product of claim 17, wherein the storing test result of the current segment comprises storing the test result of the current segment in one or more failed address registers (FAR) for the plurality of tests of memory elements of the integrated circuit chip on the current partition, and transmitting the test results to one or more inactive functional logic elements of the integrated circuit chip when the tests on the current partition are completed.

20. The computer program product of claim 14, wherein a number of partitions comprises:
   one partition;
   a predetermined number of partitions; and
   a variable number of partitions.

* * * * *